United States Patent
Snow et al.

[11] Patent Number: 5,929,199
[45] Date of Patent: Jul. 27, 1999

[54] FLUOROALIPHATIC CYANATE RESINS FOR LOW DIELECTRIC APPLICATIONS

[75] Inventors: Arthur W. Snow, Alexandria; Leonard J. Buckley, Fairfax Station, both of Va.

[73] Assignee: The United States of America as represented by the Secretary of the Navy, Washington, D.C.

[21] Appl. No.: 09/006,448

[22] Filed: Jan. 13, 1998

Related U.S. Application Data

[62] Division of application No. 08/621,149, Mar. 21, 1996, Pat. No. 5,807,967.

[51] Int. Cl.$^6$ .......................... C08G 63/44; C08G 69/00; C08G 73/24
[52] U.S. Cl. .......................... 528/288; 528/292; 528/392; 528/401; 528/422; 528/423; 528/425
[58] Field of Search .................................... 528/288, 292, 528/392, 401, 422, 423, 425

[56] References Cited

U.S. PATENT DOCUMENTS

| | | | |
|---|---|---|---|
| 3,681,292 | 8/1972 | Loudas et al. | 528/401 |
| 4,477,643 | 10/1984 | Keller | 528/70 |
| 4,745,215 | 5/1988 | Cox et al. | 528/422 |

*Primary Examiner*—P. Hampton-Hightower
*Attorney, Agent, or Firm*—Thomas E. McDonnell; John J. Karasek

[57] ABSTRACT

The present invention is a cyanate resin monomer having the formula:

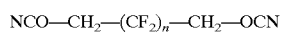

$$NCO-CH_2-(CF_2)_n-CH_2-OCN$$

where n is an even integer from 6 to 10, inclusive.

Another aspect of the invention is an essentially pure cyanate resin monomer having the formula:

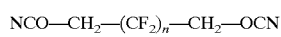

$$NCO-CH_2-(CF_2)_n-CH_2-OCN$$

where n=3, 4, 6, 8, or 10. Another aspect of the invention is a prepolymer made by the process of heating a monomer of the invention to a conversion below the gel point. Another aspect of the invention is a method for depositing an interlevel dielectric resin on an integrated circuit, having the steps: (a) coating the integrated circuit with a thin film of a prepolymer made by the process of heating a monomer of the invention to below the gel point, and (b) curing the prepolymer to at least the gel point. Another aspect of the invention is a low dielectric thermoset polymer resin made from these monomers. Another aspect of the invention is a composite of a resin of the invention combined with another material or materials, for structural and/or electronic applications. Such materials include powders and fibers made from, e.g., fused silica or quartz. Another aspect of the invention is making and purifying the monomers of the invention.

4 Claims, 2 Drawing Sheets

FLUOROALIPHATIC CYANATE RESINS FOR LOW DIELECTRIC APPLICATIONS

CROSS-REFERENCE TO RELATED APPLICATION

This is a divisional of application Ser. No. 08/621,149, filed on Mar. 21, 1996 now U.S. Pat. No. 5,807,967.

BACKGROUND OF THE INVENTION

1. Field of the Invention

The present invention relates to the synthesis, purification, processing and evaluation of materials with very low permittivity to electric fields, and to their precursors. Such materials are critical to contemporary technology for improving performance in microelectronics (faster and smaller computers), communications (antenna coatings and radomes with greater ranges for weaker signals) and other applications.

2. Description of the Related Art

The importance of low dielectric materials to microelectronics and communications was recognized many years ago, but in recent years, with emphasis in higher speed, smaller size, higher frequencies and lower operational power requirements, it has assumed a more critical role in advancing these technologies. See A. von Hippel, *Dielectric Materials and Application* (MIT Tech. Press, 1954); C. P. Smyth, *Dielectric Behavior and Structure* (1955); S. J. Mumby, "An Overview of Laminate Materials with Enhanced Dielectric Properties", *J. Electronic Materials,* 18, 241, (1989); and R. R. Tummala and E. J. Rymaszewski, *Microelectronics Packaging Handbook,* (Van Nostrand Rheinhold, 1989). In microelectronics, low dielectric materials separate conducting lines and directly influence the speed of the device operation and the heat build up within it. In communications, low dielectric materials in the form of electromagnetically transparent coatings and shells (radomes) protect sensitive antennas from weather elements, corrosion and other airborne debris, and their reflection and absorption characteristics influence the sensitivity of reception and transmission. In other applications, low dielectric materials efficiently transmit electromagnetic radiation to an absorbing filler with a minimum of reflection.

The dielectric constant and dissipation factor (loss tangent or $\tan\delta$) are the parameters that describe the utility of low dielectric materials to serve in the above applications. Physically, the dielectric constant measures a material's ability to resist a flow of charge in a specified electric field relative to that of a vacuum. When the electric field oscillates, the current resulting from the flow of charge in the material has a charging component and a loss component. The dissipation factor is the ratio of the loss current to the charging current, and is a measure of the stored electromagnetic energy that is converted to a leakage current and ultimately dissipated as heat. These two parameters factor differently into various applications and will vary with frequency, temperature, and moisture content. In all cases, however, it is desirable to have them as low as possible. As used herein, a low dielectric material is one with a dielectric constant $\leq$ about 2.7 (a low dielectric constant) and loss tangent $\leq$ about 0.002 (a low loss tangent).

As a component of a microelectronic device, a low dielectric (or low permittivity) materials serves as an interconnect material which separates conducting lines within a multichip module or between modules in a printed circuit board. The influence of the interconnect material on the performance of the electronic device is determined by the effects of the dielectric constant and loss tangent on the signal propagation delay, crosstalk and dielectric losses. When an electrical signal propagates down a given conducting line, it generates an electromagnetic field which permeates into the surrounding interconnect material. The propagation time of the signal is determined by length of the conducting line and the velocity of the signal. A dielectric interaction between the electric field from the signal and the surrounding dielectric medium detracts from the signal's energy and slows its velocity. The size of this effect is determined by a reciprocal square root dependence on the interconnect dielectric constant, thus lowering the dielectric constant will increase the signal transmission speed. Also, the distance to which the electric field permeates into the interconnect material varies with the dielectric constant. If conducting lines are positioned too close together, crosstalk will occur: the electric field generated by a signal in one line can induce a signal in another line. Reducing the dielectric constant of the interconnect reduces the required distance between conducting lines, which translates into a smaller, faster device. The dielectric loss or signal attenuation (decibel/unit length) of a conducting line is directly proportional to the dissipation factor and to the square root of the dielectric constant. This third effect also relates to operational heat build up.

In communications and radar applications, low dielectric materials serve as antenna coatings and radome skin components. Again the dielectric constant and loss tangent are critical material parameters. Large differences between dielectric constants at the air-material interface cause reflections resulting in signal loss and signal distortion. Transmission of the electromagnetic wave through the material is accompanied by a power loss due to absorption of the signal. This absorption results in heating of the material which may become severe in high power transmissions. The minimization both of the dielectric constant to reduce reflections, and of the loss tangent to reduce absorption are critical to this application. Moisture absorption and impact resistance are additional critical properties. Small quantities of adsorbed moisture cause very large increases in the dielectric constant and loss tangent. On aircraft flying at sonic and supersonic speeds, the impacts of rain, ice and small debris can cause severe physical damage.

For other applications, the low dielectric material may be a coating and/or a binder for an electromagnetic absorbing material. As such, the critical requirement is minimization of electromagnetic reflection at the air material interface which translates to a minimization of the dielectric constant.

The features of chemical composition and structure that minimize the dielectric constant and loss tangent in a material are those associated with minimal polarization in an electrical field. This relates to permanent and induced dipoles in the material and the symmetry in which they occur.

Permanent dipoles result from bonds between atoms of unequal electronegativity. Permanent dipoles tend to orient in response to an electric field. Where dipole movement is possible (as in liquids and low glass transition materials), sizeable dielectric constants and loss tangents are observed with a strong frequency dependence correlating with the time scale of molecular movement.

Induced dipoles are created by the electric field and are strongest in materials with weakly held or delocalized electrons. This includes large atoms such as those below the first row in the periodic table and multiple bond systems such as aromatic structures. Strongly electronegative atoms like fluorine are particularly resistant to polarization. Saturated fluorocarbon and hydrocarbon polymers have very low dielectric constants (i.e. 2.0 to 2.3) while polymers with polar functional groups, particularly those with a strong affinity for moisture, have significantly higher dielectric constants (i.e. greater than 3.0). Also, solid-state packing density and symmetry factor into the dielectric constant. Increasing free volume as in the case of polyisobutylene (2.2) versus polyethylene (2.3) will reduce the dielectric constant, and a symmetry where a dipole associated with a bond is canceled by opposing orientation of similar dipoles as in the case of the cyanurate structure in the cyanate resin.

Depending on the application, other properties are also desired. These include facile processing, thermal stability, moisture resistance, good mechanical properties, and adhesion.

Most types of polymer processing, particularly for thin film depositions or castings, require that the polymer is at least temporarily in a fluid state. Consequently, a broad processing window (a function of time and temperature) where the polymer is in a fluid state, is desired. In microelectronics, a spin coating deposition is commonly used, where the polymer is dissolved in a solvent. This solution, or a prepolymer made from it, is applied to the surface of a microelectronic substrate, and then spun from this substrate at high rpm, leaving a residual thin film of uniform thickness. For thermoplastic polymers, the typical final step is evaporation of any residual solvent. For thermoset polymers, the typical final step is curing the low molecular weight prepolymer initial to a macromolecular network. A prepolymer is a partially reacted thermoset system that has been cured to below the gel point and is still melt and solution processable. Preferably, prepolymers are cured to just short of the gel point (e.g., to within about 10% of the gel point). The gel point is the point where "a system loses fluidity during polymerization . . . and passes over from a viscous to a gel-like state". A. Tager *Physical Chemistry of Polymers* p. 359 (Mir Publishers, Moscow, 1979) (2d ed.). Thermosets have the advantage of resistances to solvents and temperature, but the disadvantage of entailing more complex processing. This processing requires that stoichiometry not be upset by fractionation during spin casting when more than one monomer is involved.

Different applications will require different degrees of thermostability. In microelectronics applications, stability throughout a soldering operation (10 to 20 minute duration of 300 to 425° C.) is desired. In radome applications, sustained thermal stability at an aircraft leading edge (about 150–200° C.) is desired.

Moisture resistance is critical as a few percent absorption will seriously deteriorate the electric properties. Moisture will also advance corrosion at metal interfaces.

The important mechanical properties are mostly an impact or brittleness resistance for radomes to rain/ice and for circuit boards to drilling operations. At interfaces, adhesion to substrates or reinforcements must be sufficient to withstand subsequent processing and operational stresses. Also the interface must be stable to metal ion migration in the microelectronics operation.

SUMMARY OF THE INVENTION

Accordingly, it is an object of this invention to provide polymers having adventitiously low dielectric constants and loss tangents.

It is a further object of this invention to provide these polymers with high thermal stability, good impact resistance, low moisture absorption, and good machinability.

It is a further object of the invention to make these polymers into thin films, castings, and composites (such as composites of resin and fibers including quartz fibers and other fibers used to make composites used for radomes).

It is a further object of the invention to make precursors (monomers and prepolymers) for these polymers.

It is a further object of the invention to provide methods for obtaining monomers of sufficient purity required for controlled curing during processing operations.

These and additional objects of the invention are accomplished by the structures and processes hereinafter described.

The present invention is a cyanate resin monomer having the formula:

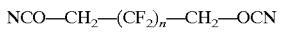

where n is an even integer from 6 to 10, inclusive.

Another aspect of the invention is an essentially pure cyanate resin monomer having the formula:

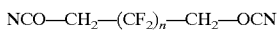

where n=3, 4, 6, 8, or 10.

Another aspect of the invention is a prepolymer made by the process of heating a monomer of the invention to a conversion below the gel point.

Another aspect of the invention is a method for depositing an interlevel dielectric resin on an integrated circuit, having the steps: (a) coating the integrated circuit with a thin film of a prepolymer made by the process of heating a monomer of the invention to below the gel point, and (b) curing the prepolymer to at least the gel point.

Another aspect of the invention is a low dielectric thermoset polymer resin having repeating units with the formula:

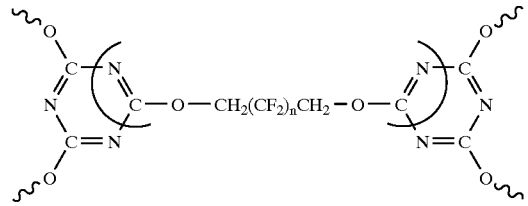

where n is an even integer from 6 to 10, inclusive.

Another aspect of the invention is a composite of a resin of the invention combined with another material or materials, for structural and/or electronic applications. Such materials include powders and fibers made from, e.g., fused silica or quartz.

Another aspect of the invention is making and purifying the monomers of the invention.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

Figure 1:
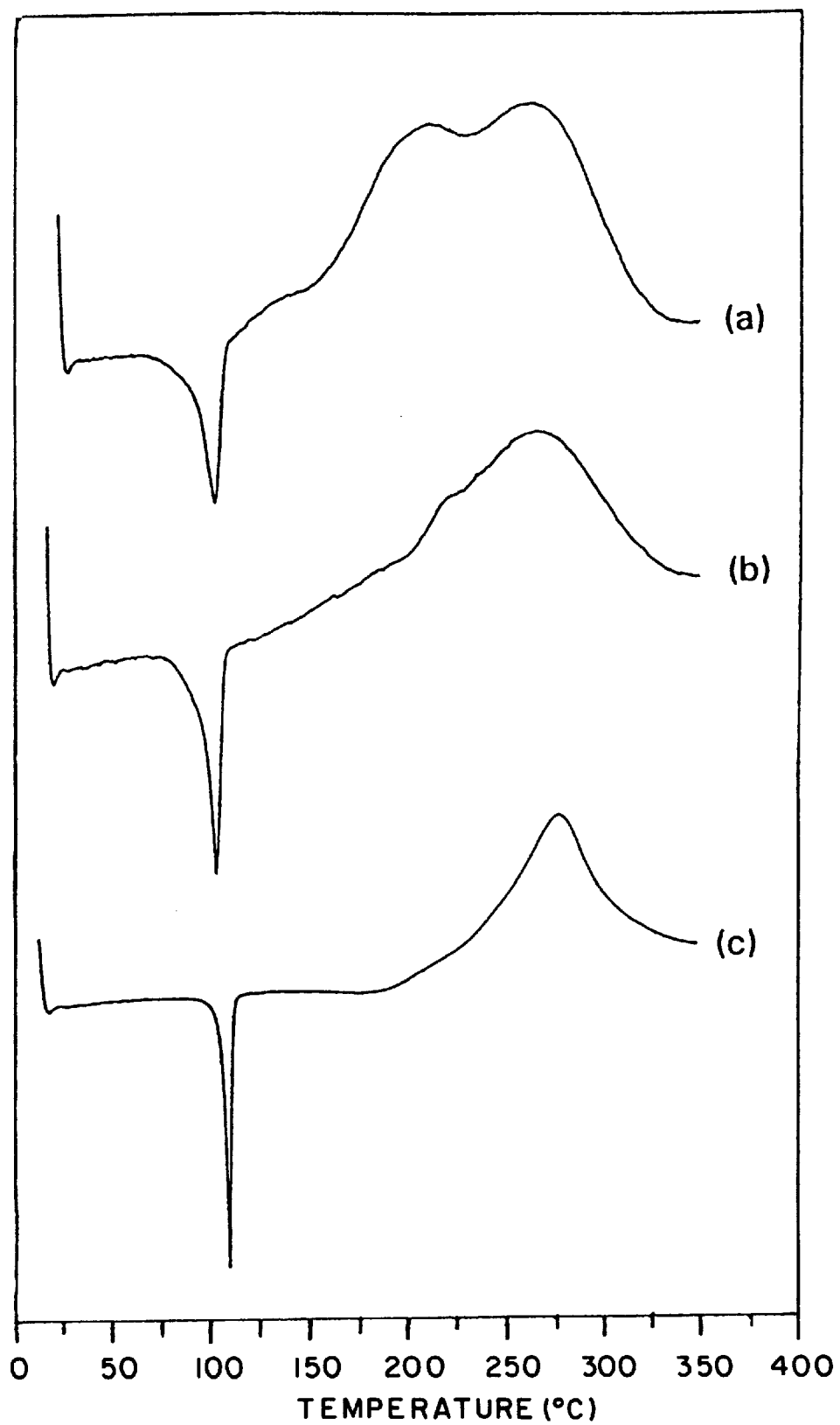
FIG. 1 shows a product processing window after 0, 1 and 2 recrystallizations.

The synthesis and processing of aromatic cyanate ester resins is well known to those skilled in the art. The following references provide comprehensive review: I. Hamerton (editor), *Chemistry and Technology of Cyanate Ester Resins*, Chapman & Hall (1994); T. Fang and D. A. Shimp, "Polycyanate Esters: Science and Applications. A Comprehensive Review Since 1977", *Progress in Polymer Science*, O. Vogel (editor), Vol. 19, Elsevier, (1995). Specific details for particular aromatic cyanate ester resins may be found in the many articles cited in the above reviews. The fluoromethylene aliphatic cyanate ester resins of the subject invention follow similar general trends observed for the aromatic cyanate resins but with many significant and unexpected differences in synthesis, purification, processing and properties.

With Respect to Monomers of the Invention

In 1973, 3M patented resins with bifunctional fluoroaliphatic and fluoroalkylether aliphatic cyanate esters (U.S. Pat. Nos. 3,681,292 and 3,733,349). These patents essentially describe the synthesis of fluoroaliphatic cyanate monomers and oligomers based on the conventional aromatic cyanate ester synthesis and heating them to obtain elastomers and plastic materials. No isolation and characterization of the fluoroaliphatic cyanate monomers/oligomers is described (it has been discovered that some of these monomers are high melting crystalline solids, which is an unexpected result), no description of processing as coatings, castings or composites, in particular, nothing is mentioned about the dielectric properties and the applications that are the subject of this disclosure. It has been further discovered that fluoroaliphatic cyanate monomers are substantially more reactive than aromatic cyanates and that their cure is strongly catalyzed by traces of residual unreacted fluoromethylol precursor and carbamate and diethylcyanamide byproducts. While the chemistry taught by U.S. Pat. Nos. 3,681,292 and 3,733,349 for the NCOCH$_2$(CF$_2$)$_n$CH$_2$OCN series is reproducible as reported, the stability, storage and processing characteristics are unacceptable. Monomer prepared this way on occasion reacts out of control and cures far too rapidly to be useful for the controlled processing conditions necessary for practical applications. Further, the storage of this monomer is impracticable because the reactivity is such that gel particulate formation occurs after a few weeks at storage temperatures of 20, 5 or even –20° C. The source of the problem is an uncontrolled quantity of catalytic impurities generated during the synthesis reaction and not separated thereafter. When purification of monomers prepared as described by U.S. Pat. Nos. 3,681,292 and 3,733,349 is undertaken by conventional methods such as recrystallization and distillation, losses of up to 90% are experienced as a result of necessary heating associated with these methods, and the quality of purified product is marginal. To obtain acceptable yields of purified product, it has been found necessary to redesign the synthesis along with analytical diagnostics as to the purity.

The synthesis procedure for cyanating fluoromethylol taught in U.S. Pat. Nos. 3,681,292 and 3,733,349 is that the cyanation reaction of a fluoromethylol precursor is carried out by reacting it with an excess amount of cyanogen halide in the presence of an amount of base (triethylamine) sufficient to neutralize the hydrogen halide produced in the reaction. The preferred excess of cyanogen halide is up to 50%, and the amount of base is quantitatively unspecified. The fluoromethylol precursor is added to a cold solution of cyanogen halide solution followed by dropwise addition of the triethylamine while maintaining a preferable –20 to 0° C. temperature. The product is recovered by dilution with a water-immiscible organic solvent, extraction with water, separation, drying and concentration of the organic phase. No further purification is taught, and this product is claimed to be adequate for subsequently preparing fluorocarbon cyanurate polymers. It has been discovered that the product produced by this procedure is too reactive for controlled processing and storage because of the presence of strongly catalytic impurities that are not separated during the product recovery. These impurities include unreacted cyanation reaction reagents (fluoromethylol precursor and triethylamine) and byproducts of side reactions (e.g., imidocarbonate, diethylcyanamide, fluorocarbamate and cyanurate). These are active hydrogen or basic compounds both of which strongly catalyze the cyanate trimerization cure reaction. Their exclusion requires a redesign of the synthesis and subsequent purification by recrystallization, sublimation, or distillation that is not taught in U.S. Pat. Nos. 3,681,292 and 3,733,349.

The cyanation reaction has three features which should be incorporated into the synthesis procedure. The desired reaction is that the fluoroalkylmethyleneoxide ion pair intermediate

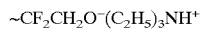

(generated by proton abstraction from the fluoromethylol reagent to the base) react with the cyanogen halide to produce the fluoroalkylmethylene cyanate product:

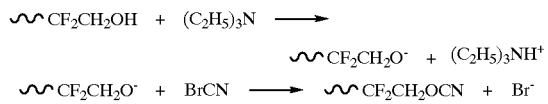

Three competing side reactions to be avoided are formation of imidocarbonate, diethylcyanamide and carbamate (hydrolysis):

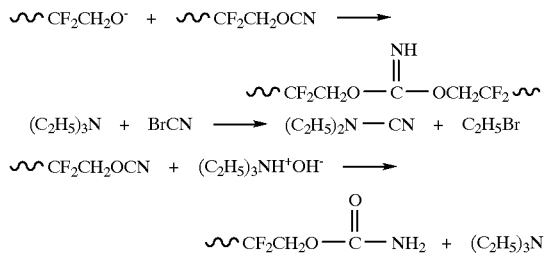

The ~ in the structures shown above denotes the remainder of the bifunctional molecule, which is omitted for simplicity.

To avoid imidocarbonate formation, the concentration of fluoroalkylmethyleneoxide preferably is minimized relative to that of the fluoromethylene cyanate product. This may be accomplished by using the right order of addition of reagents (i.e. the fluoroalkylmethyleneoxide is consumed immediately after addition or generation). To avoid diethylcyanamide formation, the reaction temperature preferably is kept low to favor reaction of the cyanogen halide with the fluoroalkylmethyleneoxide over the triethylamine. However, a total conversion of the fluoromethylol groups to fluoromethylcyanate groups is strongly desired, and an excess of cyanogen halide and triethylamine are used to help insure this and to compensate for the cyanogen halide and triethylamine consumed by the side reaction. This makes some diethylcyanamide formation unavoidable. Carbamate formation is a consequence of reaction of cyanate product with adventitious water in the presence of triethylamine. To avoid carbamate formation, solvents and reagents should be dried to exclude water.

It has been discovered that these detrimental catalytic impurities can be significantly reduced in concentration and separated by new and improved synthesis and purification methods. This synthesis method involves prereacting the fluoromethylol precursor $(HOCH_2(CF_2)_nCH_2OH)$ with a stoichiometric equivalence of the base (triethylamine) and subsequent dropwise addition of this adduct to the cold solution of cyanogen halide. The purification method involves extraction followed by recrystallization, distillation, or sublimation and is accompanied by analytical diagnostics of differential scanning calorimetry and NMR spectroscopy.

The cyanation reaction of this invention is preferably carried out using dry organic solvents in a moisture-excluded apparatus. The cyanogen halide is dissolved in an organic solvent (e.g., acetone, chloroform, methylene chloride, tetrahydrofuran, 2-propanol) and cooled in the reactor to the temperature at which the cyanation reaction is conducted (0 to –40° C., and preferably –25 to –20° C.). The quantity of cyanogen halide is no more than 5% excess of the stoichiometric equivalence relative to the fluoromethylol reagent. A second solution is prepared by dissolving the fluoromethylol precursor in the organic solvent followed by addition of a stoichiometric quantity of base (triethylamine). This solution is slowly added to the cyanogen halide solution in the reactor at a rate such that the –25 to –20° C. temperature range can be maintained during this exothermic reaction. After the addition is complete, the reaction mixture is stirred for 15 minutes at the reaction temperature.

Heating should be avoided during product recovery and purification operations. The product preferably is isolated by filtering any precipitated triethylammonium halide salt from the cold reaction mixture. A cold water-immiscible solvent (e.g., methylene chloride, chloroform, or fluorocarbon solvent) in a volume of approximately one half that of the reaction mixture is added, and this mixture is extracted (e.g., four extractions with an equal volume of cold 1% NaCl solution). The nonaqueous phase is then dried (e.g., over anhydrous $NaSO_4$ or $MgSO_4$), and typically rotary evaporated and vacuum dried at room temperature.

The product is purified preferably by cold recrystallization. The recrystallization solvent should be one where the product has appreciable solubility (e.g. 5 to 50%) at 25° C. but significantly less at –25° C. Solvents such as chloroform, dichloroethane, trichloroethane, diethylether acetone, 2-propanol and mixtures thereof have been found to be effective with 2-propanol considered preferable. The product is dissolved in the recrystallization solvent, cooled and recrystallized at –25° C. for one to two hours then filtered cold and vacuum dried immediately. Two such recrystallizations are usually necessary to obtain a purified product with a good processing window.

The processing window is evaluated from a differential scanning chromatogram. An example of a product processing window after 0, 1 and 2 recrystallizations is presented in FIG. 1. The temperature range between the melting endotherm and the onset of the cure exotherm is the processing window. The processing window stability is a quantity of time for a monomer to convert to the gel point of the thermoset at a specified temperature in the processing window.

Melting point, as determined visually or by DSC melting endotherm onset, is suitable for determining overall monomer purity. As used herein, the term essentially pure refers to a monomer sample that melts at a temperature greater than or equal to the temperatures listed in Table I:

TABLE I

Melting Points of Monomers of the Invention

| n | 3 | 4 | 6 | 8 | 10 |
|---|---|---|---|---|---|
| $M_p$ (° C.) | –2 | 15 | 109 | 125 | 175 |

As the concentration of catalytic impurities diminishes, the cure exotherm progresses to higher temperatures, declines in intensity, and may be a superposition of an evaporation endotherm with the cure exotherm. Once this level of purity is obtained, the monomer is stable to storage and may be processed under controlled resin cure conditions with or without cure catalysts. Generally speaking, at least a minimal processing window (e.g., about 10° C.) is usually necessary. Wider processing windows (e.g., 50–100° C.) are preferred. As seen in FIG. 1, a processing window of about 75° C. is readily obtainable. As diagnostics for the presence of specific impurities, the $^1H$ NMR resonance of the methylene protons and the $^{19}F$ NMR resonance of the terminal $CF_2$ fluorides are particularly useful. The $^1H$, $^{13}C$ and $^{19}F$ NMR resonances of the $NCOCH_2(CF_2)_6CH_2OCN$ monomer and related impurities are summarized in Table II.

For the lower members of the $NCOCH_2(CF_2)_nCH_2OCN$ series (n=3,4) Kugelrohr distillation and (n=6) sublimation are practicable but product purity and isolated yield are not as high as with recrystallization.

With Respect to Prepolymers of the Invention

Another object of the invention is to prepare a prepolymer from the monomers of the invention. Such a prepolymer is made by the process of heating a monomer having the formula

$NCO—CH_2—(CF_2)_n—CH_2—OCN$ wherein n is an even integer from 6 to 10, inclusive, to a resin conversion below the gel point. The gel point is defined above.

In such a heating process, less than 52% of the cyanate groups in the monomer react, to form a soluble cyanurate prepolymer. Typically, between 10% and 50% of the cyanate groups in the monomer react, to form a soluble cyanurate prepolymer. Preferably, between about 30% and about 50% of the cyanate groups in the monomer react. More preferably, between about 40% and about 50% of the cyanate groups in the monomer react. For use in coatings applications, the solvent-soluble prepolymer should be suitable for making a solution that has a viscosity that is compatible with spin coating a uniform film of less than 2 microns thickness. The prepolymer should be essentially free of gel particles.

With Respect to Thermoset Polymers of the Invention, and to Processing these Thermosets Another aspect of the invention is processing of the fluoroalkylmethylene dicyanate monomers into fluoroaliphatic cyanate thermoset resins. This includes processing as neat resin castings, thin films and composites.

For processing as neat resin castings, the procedure involves degassing the molten monomer under moderate vacuum (40 torr), transfer to a mold and a simple thermal cure schedule. The cure schedule involves heating the monomer to 120° C. or to just above its melting point until gelation occurs (2 to 4 hour) followed by postgelation cure at 175° C. If the molten monomer does not convert to the gel point in the initial 4 hour cure step, a small quantity (less than 1%) of the fluoromethylol precursor may be added as a catalyst). Alternately, transition metal catalyst packages may be added as is well-known for the art of curing aromatic cyanates. (See D. A. Shimp, *Engineering Materials Handbook*, Vol. 2, *Engineering Plastics*, ASM International, pp. 232–239, 1988; D. A. Shimp, U.S. Pat. No. 4,847,233)

For processing as thin film to be deposited on microelectronic substrates and subsequently cured, the monomer is converted to a thermoset prepolymer, as described above. This prepolymer is soluble and of sufficient molecular weight that when dissolved in a solvent generates a solution viscosity appropriate for spin coating thin films (less than 2 microns) of uniform thickness. This conversion is carried out by simple heating of the neat monomer melt or by heating the monomer in a solvent while monitoring the percent of cyanate groups reacted. The higher conversion range is preferable because it diminishes residual monomer crystallinity in the film before final curing and generates a higher specific viscosity allowing for the use of more dilute solutions and efficient use of prepolymer. It is strongly desired to stop the conversion just short of 52% because at and beyond this point, gel particles form which are extremely difficult to separate and detrimental to the quality of the spin coated film. The conversion is conveniently monitored by the $^1$H NMR and $^{19}$F NMR resonances of the respective methylene protons and terminal $CF_2$ fluorines of the monomer. Alternately, the intensity of the C≡N stretching mode of cyanate group in the infrared spectrum may be used. Solvents useful for the spin coating are typically acetone, methylethyl ketone, chloroform, ethyl acetate and N-methylpyrrolidone (NMP). NMP is also used as a solvent for prepolymer formation. The spin coated prepolymer is cured on the substrate by procedure analogous to that for the castings.

Processing the fluoroaliphatic resin into composite objects involves an impregnation of the molten monomer or prepolymer into the reinforcement followed by a final curing operation analogous to that for the casting. The reinforcement may be a small particle particulate or a fiber. For low dielectric applications the reinforcement would also be a low dielectric material such as polytetrafluoroethylene, polyethylene, quartz or other reinforcements conventionally used in printed circuit boards and radomes.

Figure 2:
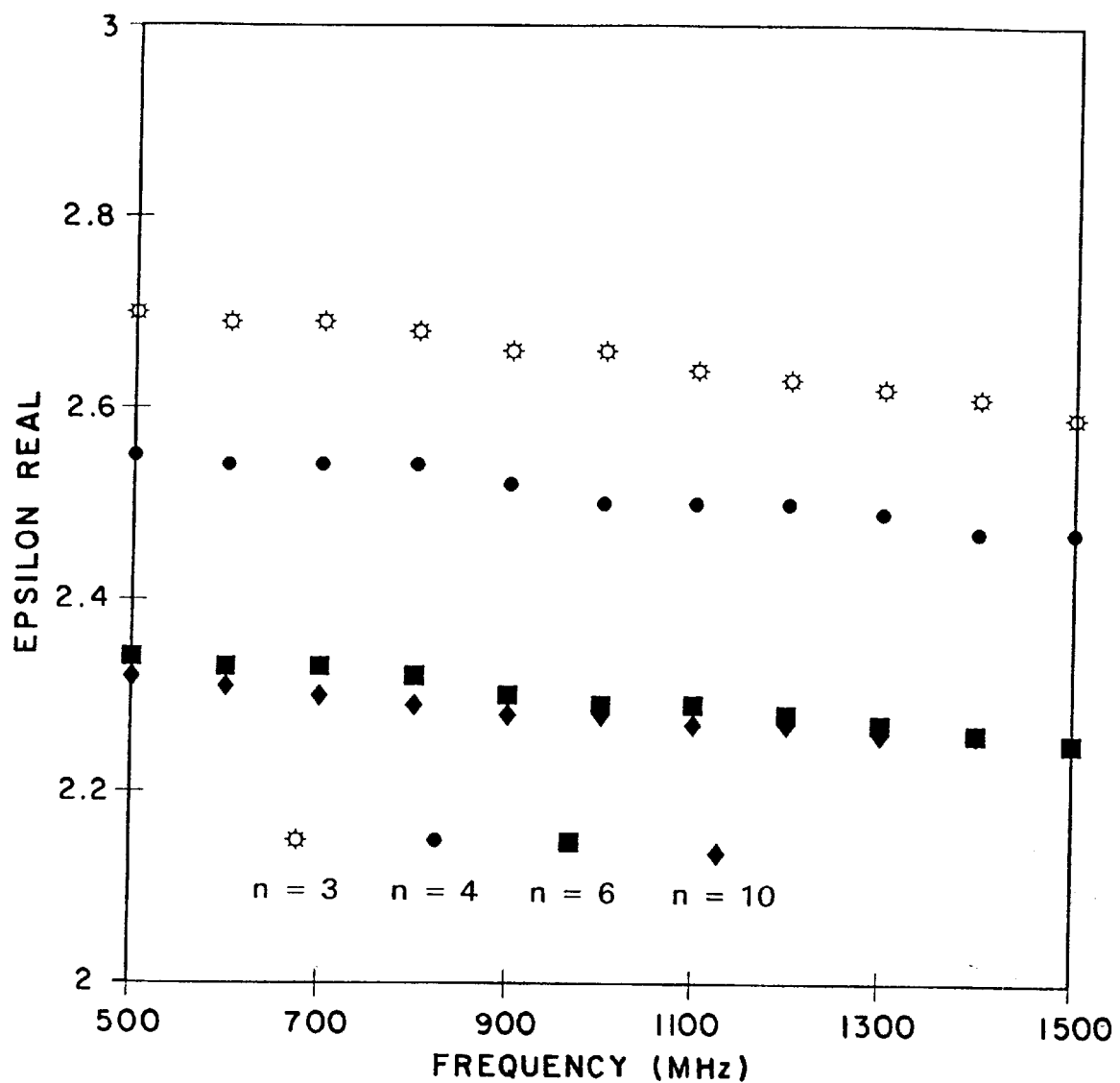
FIG. 2 shows dielectric constants of the NCOCH$_2$(CF$_2$)$_n$CH$_2$OCN resin systems as a function of frequency.

The fluoroaliphatic resins of the invention have certain physical properties which qualify them for the low dielectric applications cited above. In addition to permittivity to electric fields, these properties include thermal stability, moisture absorption and mechanical properties. The length of the fluoromethynene chain correlates with decreasing dielectric constant (See FIG. 2), decreasing moisture absorption and increasing thermal stability (See Table II). In general, the resins of the subject invention have dielectric constants in the range 2.3 to 2.6, loss tangents lower than 0.02 and moisture absorption of ranging from 0.11 to 1.6.

With Respect to Composites according to the Invention

Another aspect of the invention is the use of the resins of the invention as a matrix for the formation of composites with reinforcements that are important in low dielectric applications technology. These reinforcements include polytetrafluoroethylene (PTFE) and quartz or fused silica.

PTFE has an exceptionally low dielectric constant (2.0) and tanδ (0.0002), but has a surface that is very difficult to wet and adhere to. The high fluorine content of the subject invention resins contributes to an exceptionally good wetting of the PTFE surface by the molten monomer and prepolymer. After curing, adhesion at this interface is also very good. Composites of 10 to 60% (by weight) PTFE fiber, coarse particle, and fine particle, are made by impregnation with molten monomer or prepolymer, followed by neat resin curing procedures.

Quartz or fused silica has excellent thermal and mechanical properties, combined with good dielectric properties (dielectric constant=3.7, tanδ=0.0002) for an inorganic reinforcement. Composites of 20 to 60% (by weight) are made by impregnating fused silica fibers or powders with molten monomer or prepolymer, followed by neat resin curing procedures.

Having described the invention, the following examples are given to illustrate specific applications of the invention, including the best mode now known to perform the invention. These specific examples are not intended to limit the scope of the invention described in this application.

EXAMPLE 1

Synthesis and purification of the $NCOCH_2(CF_2)_6CH_2OCN$ monomer. To a suitable reactor under slight positive pressure of dry nitrogen was added 75 ml of dry acetone. The temperature was lowered to −10° C. and 12.30 g (0.116 mol) of dry cyanogen bromide were added and dissolved by stirring. A 20.00 g quantity of the (0.0552 mol) $HOCH_2(CF_2)_6CH_2OH$ fluoromethylol precursor (0.0552 mol) was weighted into a flask followed by dissolution in 25 ml of dry acetone. A 11.16 g quantity of triethylamine (0.1104 mol) was added to the fluoromethylol/acetone solution, and, after mixing, this solution was transferred to an addition funnel to the reactor. The reactor temperature was further lowered to −25° C., and the fluoromethylol+triethylamine/acetone solution was added dropwise with vigorous stirring over a 40 minute period while maintaining temperature in the −25 to −20° C. range. This temperature and stirring were continued for 15 minutes after completion of the addition. The precipitated triethylammonium bromide salt was filtered from the reaction mixture while cold, washed with 100 ml of methylene chloride (previously cooled to −20° C.), and the combined acetone and methylene chloride solutions were extracted four times with cold (−10° C.) 1% solution of sodium chloride in water. The nonaqueous phase was dried over anhydrous sodium sulphate, filtered and evaporated to dryness at 20° C. under vacuum.

The crude product was recrystallized by dissolving in 2-propanol (1:6 weight ratio) at 25° C., then cooled to −25° C. and recrystallized for 45 minutes. The cold crystallized product was rapidly collected by filtration, washed with cold (−25° C.) 2-propanol and vacuum dried at 20° C. This recrystallization was repeated a second time to yield the purified product of melting point 109–110° C.

EXAMPLE 2

Synthesis and purification of the $NCOCH_2(CF_2)_8CH_2OCN$ monomer. The procedure was identical to that of Example 1, except relative quantities of the triethylamine and cyanogen bromide reagents were adjusted so that a stoichiometric relationship with the fluoromethylol reagent was identical to that of Example 1, and a larger quantity of 2-propanol was used to compensate for the lesser solubility of the product. Melting point of the purified product was 125–126° C.

EXAMPLE 3

Synthesis and purification of the NCOCH$_2$(CF$_2$)$_{10}$CH$_2$OCN monomer. The procedure was identical to that of Example 1, except relative quantities of the triethylamine and cyanogen bromide reagents were adjusted so that a stoichiometric relationship with the fluoromethylol reagent was identical to that of Example 1, and a larger quantity of 2-propanol was used to compensate for the lesser solubility of the product. Melting point of the purified product was 175–176° C.

EXAMPLE 4

Synthesis and purification of the NCOCH$_2$(CF$_2$)$_4$CH$_2$OCN monomer. The procedure was identical to that of Example 1, except relative quantities of the triethylamine and cyanogen bromide reagents were adjusted so that a stoichiometric relationship with the fluoromethylol reagent was identical to that of Example 1, and a larger quantity of 2-propanol was used to compensate for the lesser solubility of the product. Melting point of the purified product was 15–17° C.

EXAMPLE 5

Synthesis and purification of the NCOCH$_2$(CF$_2$)$_3$CH$_2$OCN monomer. The procedure was identical to that of Example 1, except relative quantities of the triethylamine and cyanogen bromide reagents were adjusted so that a stoichiometric relationship with the fluoromethylol reagent was identical to that of Example 1. The melting point of this monomer was too low for recrystallization, and the monomer was purified by Kugelrohr vacuum distillation (30° C./0.025 torr). Melting point of the purified product was −2° C.

EXAMPLES 6–8

Processing of NCOCH$_2$(CF$_2$)$_n$CH$_2$OCN, n=3,4,6, as cured neat resin castings. The monomer melt was degassed at 120° C./40 torr then transferred to a 120° C. preheated mold and cured according to the schedule 120° C./4 hour→175° C./4 hour→225° C./1 hour. The electrical, moisture adsorption, densities and thermal properties are described in Table III.

EXAMPLE 9

Processing of NCOCH$_2$(CF$_2$)$_{10}$CH$_2$OCN as a cured neat resin casting. This monomer was compressed at 2000 psi into a 13.5×1 mm disc and cured in a conforming mold according to the schedule 180° C./2 hour→225° C./2 hour. The electrical and moisture adsorption properties are described in Table III.

EXAMPLE 10

Use of an active hydrogen catalyst in processing of NCOCH$_2$(CF$_2$)$_6$CH$_2$OCN as a cured neat resin casting. One weight percent of HOCH$_2$(CF$_2$)$_6$CH$_2$OH was added to the monomer (other phenols and/or fluorinated alcohols may be substituted for this curing catalyst). This was dissolved in the monomer melt, degassed and cured as in examples 6–8. Gelation occurred in less than one hour reaction time.

EXAMPLE 11

Use of a transition metal salt with an active hydrogen catalyst in processing of NCOCH$_2$(CF$_2$)$_6$CH$_2$OCN as a cured neat resin casting. One weight percent of catalyst solution (0.075 g copper acetylacetonate in 1.00 g nonylphenol) was added to the monomer. This was stirred, degassed and cured as in examples 6–8. Gelation occurred in less than one hour reaction time. Other TM complexes and other phenols may be substituted.

EXAMPLE 12

Processing of NCOCH$_2$(CF$_2$)$_6$CH$_2$OCN as a soluble prepolymer for spin coating and curing on microelectronic substrates. The monomer was cured uncatalyzed at 160° C. to a conversion of 46% as monitored by NMR. This soluble prepolymer was dissolved in acetone (32% by weight) and deposited onto silicon and metal/silicon wafers. Spin casting conditions ranged from accelerations of 50 to 100 rpm/sec and final speeds of 1500 to 5000 rpm. A 1 micron thick coating was deposited on a 50 mm diameter wafer at 1500 rpm with an acceleration of 50 rpm/sec and subsequently cured at 180° C./2 hour.

EXAMPLE 13

Polytetrafluoroethylene reinforced NCOCH$_2$(CF$_2$)$_6$CH$_2$OCN resin composite. A mixture of one part by weight polytetrafluoroethylene 10 micron particles and two parts by weight NCOCH$_2$(CF$_2$)$_6$CH$_2$OCN monomer were mechanically interdispersed, fused, ground to a powder and compressed at 5000 psi into a 1 mm thick specimen. The composite specimen was cured as in Examples 6–8. The dielectric constant and tanδ at 1 GHz were 2.14 and 0.018 respectively.

EXAMPLE 14

Fused silica reinforced NCOCH$_2$(CF$_2$)$_6$CH$_2$OCN resin composite. A mixture of one part by weight silica 1.5 micron particles and two parts by weight NCOCH$_2$(CF$_2$)$_6$CH$_2$OCN monomer were mechanically interdispersed, fused, ground to a powder and compressed at 12000 psi into a 1 mm thick specimen. The composite specimen was cured as in Examples 6–8. The dielectric constant and tanδ at 1 GHz were 2.85 and 0.016 respectively.

TABLE II

NMR of NCOCH$_2$(CF$_2$)$_6$CH$_2$OCN Analogs
X—CH$_2$—CF$_2$—CF$_2$—CF$_2$—CF$_2$—CF$_2$—CF$_2$—
 a    b    c    d    e    f    g

| | $^1$H | $^{13}$C | | $^{19}$F | |
|---|---|---|---|---|---|
| X | b | a | b | c | d | e/f, g |
| HO— | 4.08 | — | 60.1 | −121.5 | −123.2 | −121.8 |
| NCO— | 5.46 | 111.5 | 73.3 | −120.1 | −122.7 | −121.5 |
| H$_2$NCOO— | 4.69 | 155.1 | 59.4 | −119.5 | −123.0 | −121.6 |
| N=C—O— | 5.26 | 173.2 | 63.8 | −118.9 | −122.6 | −121.5 |

Spectra were obtained from samples dissolved in acetone-d$_6$ at 23° C. Chemical shifts are referenced in ppm against TMS and CFCl$_3$

TABLE III

High Frequency Permittivity, 100° C./100 hr Moisture Absorption, Density, Glass Transition Temperature and Thermostability of $NCOCH_2(CF_2)_nCH_2OCN$ Resin Systems.

| n | ε (15 GHz) | tanδ (15 GHz) | % moisture (100° C./100 hr) | density (g/cm$_3$) | Tg (° C.) | (Δm/t)$_{300°\,C.}$ (%/min) |
|---|---|---|---|---|---|---|
| 3 | 2.53 | 0.01 | 1.67 | 1.777 | 82 | −0.0196 |
| 4 | 2.54 | 0.02 | 0.93 | 1.820 | 72 | −0.0191 |
| 6 | 2.32 | 0.001 | 0.75 | 1.862 | 98 | −0.0156 |

Obviously, many modifications and variations of the present invention are possible in light of the above teachings. It is therefore to be understood that, within the scope of the appended claims, the invention may be practiced otherwise than as specifically described.

What is claimed is:

1. A low dielectric thermoset polymer resin consisting essentially of repeating units having the formula:

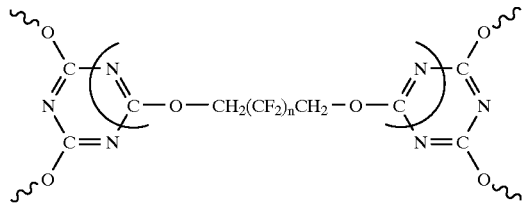

wherein n is an even integer from 6 to 10, inclusive.

2. The resin of claim 1, wherein n is 6.
3. The resin of claim 1, wherein n is 10.
4. The resin of claim 1, wherein said resin has a loss tangent lower than 0.02.

* * * * *